United States Patent
Harada et al.

(10) Patent No.: US 8,095,338 B2
(45) Date of Patent: Jan. 10, 2012

(54) DATA PROCESSING APPARATUS AND METHOD

(75) Inventors: Yoshihiro Harada, Fukuoka (JP); Shinji Takao, Fukuoka (JP); Kiyoshi Kitamura, Fukuoka (JP); Isao Takata, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 409 days.

(21) Appl. No.: 12/320,995

(22) Filed: Feb. 10, 2009

(65) Prior Publication Data

US 2009/0276171 A1 Nov. 5, 2009

(30) Foreign Application Priority Data

May 2, 2008 (JP) .................................. 2008-120136

(51) Int. Cl.
*G05B 13/00* (2006.01)
*G06F 19/00* (2011.01)
*G06F 17/40* (2006.01)

(52) U.S. Cl. .......... 702/182; 700/32; 702/187; 702/189; 713/300; 713/320; 713/340

(58) Field of Classification Search ................ 73/432.1, 73/865.8, 865.9; 324/72, 73.1; 340/500, 340/540, 657, 679; 700/1, 28, 32, 90; 702/1, 702/57, 60, 64, 65, 127, 182, 186, 187, 189; 713/1, 2, 100, 300, 31, 320, 330, 340, 310
See application file for complete search history.

(56) References Cited

U.S. PATENT DOCUMENTS

| | | | | |
|---|---|---|---|---|
| 3,321,613 A * | 5/1967 | Searle | ......................... | 702/182 |
| 5,692,204 A * | 11/1997 | Rawson et al. | ............... | 713/340 |
| 5,727,208 A * | 3/1998 | Brown | ......................... | 713/100 |
| 6,167,524 A * | 12/2000 | Goodnow et al. | ............. | 713/300 |
| 6,889,330 B2 * | 5/2005 | Chauvel et al. | ............... | 713/300 |
| 6,901,521 B2 * | 5/2005 | Chauvel et al. | ............... | 713/300 |
| 6,986,021 B2 * | 1/2006 | Master et al. | .................... | 712/15 |
| 7,134,029 B2 * | 11/2006 | Hepner et al. | ................ | 713/300 |
| 7,320,062 B2 * | 1/2008 | Master et al. | .................... | 712/15 |
| 7,725,848 B2 * | 5/2010 | Nebel et al. | .................... | 716/136 |
| 7,788,516 B2 * | 8/2010 | Conroy et al. | ................ | 713/340 |
| 2002/0042887 A1 * | 4/2002 | Chauvel et al. | ............... | 713/300 |
| 2002/0055961 A1 * | 5/2002 | Chauvel et al. | ............... | 708/100 |
| 2003/0102889 A1 * | 6/2003 | Master et al. | ................... | 326/41 |
| 2003/0105949 A1 * | 6/2003 | Master et al. | ................. | 713/100 |

(Continued)

FOREIGN PATENT DOCUMENTS

EP 1 906 326 A1 4/2008

(Continued)

*Primary Examiner* — Edward Cosimano
(74) *Attorney, Agent, or Firm* — Staas & Halsey LLP

(57) ABSTRACT

A data processing apparatus includes a storing unit that stores, for each device, pieces of configuration data defining respective logic circuits that demonstrate different processing performance; a logic circuit configuration unit that configures a combination of the logic circuits onto the devices by reading a piece of the configuration data for each device, from among the pieces of the configuration data stored, and inputting the read pieces of the configuration data to the devices, respectively; a measuring unit that measures total power consumption required at execution of the data processing by the devices; and a logic circuit determining unit that determines, from among combinations of the logic circuits configured, a combination in which an actually measured value of total power consumption falls within a predetermined target value and which demonstrates optimum processing performance as the logic circuits to be configured onto the devices at actual execution of the data processing.

4 Claims, 5 Drawing Sheets

U.S. PATENT DOCUMENTS

| | | | |
|---|---|---|---|
| 2005/0102539 A1* | 5/2005 | Hepner et al. | 713/300 |
| 2005/0204316 A1* | 9/2005 | Nebel et al. | 716/2 |
| 2006/0031660 A1* | 2/2006 | Master et al. | 712/15 |
| 2006/0212255 A1 | 9/2006 | Hasui | |
| 2007/0050650 A1* | 3/2007 | Conroy et al. | 713/300 |
| 2008/0082947 A1 | 4/2008 | Ueda et al. | |
| 2008/0098203 A1* | 4/2008 | Master et al. | 712/28 |
| 2009/0172137 A1* | 7/2009 | Master et al. | 709/222 |
| 2011/0060932 A1* | 3/2011 | Conroy et al. | 713/340 |

FOREIGN PATENT DOCUMENTS

| | | |
|---|---|---|
| JP | 2004-022724 | 1/2004 |
| JP | 2006-244429 | 9/2006 |
| JP | 2008-090522 | 4/2008 |

* cited by examiner

FIG.3

| | | ROM 20 |
|---|---|---|
| BLOCK 1 | PERFORMANCE: HIGH | A |
| | PERFORMANCE: LOW | B |
| BLOCK 2 | PERFORMANCE: HIGH | C |
| | PERFORMANCE: LOW | D |
| BLOCK 3 | PERFORMANCE: HIGH | E |
| | PERFORMANCE: LOW | F |
| BLOCK 4 | PERFORMANCE: HIGH | G |
| | PERFORMANCE: LOW | H |
| BLOCK 5 | PERFORMANCE: HIGH | I |
| | PERFORMANCE: LOW | J |
| BLOCK 6 | PERFORMANCE: HIGH | K |
| | PERFORMANCE: LOW | L |
| BLOCK 7 | PERFORMANCE: HIGH | M |
| | PERFORMANCE: LOW | N |
| BLOCK 8 | PERFORMANCE: HIGH | O |
| | PERFORMANCE: LOW | P |

FIG.4

| PRIORITY ORDER TABLE NUMBER | PRIORITY ORDER: HIGH | PRIORITY ORDER: MEAN | PRIORITY ORDER: LOW |
|---|---|---|---|
| | BLOCK 1<br>BLOCK 2<br>BLOCK 3 | BLOCK 4<br>BLOCK 5 | BLOCK 6<br>BLOCK 7<br>BLOCK 8 |
| NO.4 | PERFORMANCE: HIGH | PERFORMANCE: HIGH | PERFORMANCE: HIGH |
| NO.3 | PERFORMANCE: HIGH | PERFORMANCE: HIGH | PERFORMANCE: LOW |
| NO.2 | PERFORMANCE: HIGH | PERFORMANCE: LOW | PERFORMANCE: LOW |
| NO.1 | PERFORMANCE: LOW | PERFORMANCE: LOW | PERFORMANCE: LOW |

FIG.5

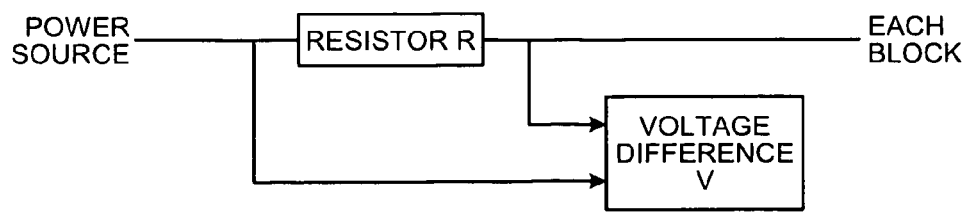

FIG.6

| | | BLOCK 1 | BLOCK 2 | BLOCK 3 | BLOCK 4 | BLOCK 5 | BLOCK 6 | BLOCK 7 | BLOCK 8 |
|---|---|---|---|---|---|---|---|---|---|
| PRIORITY ORDER TABLE NUMBER (No. 4) | | | | | | | | | |
| (A) | PERFORMANCE INFORMATION | HIGH | HIGH | HIGH | HIGH | HIGH | HIGH | HIGH | HIGH |
| | CONFIGURATION DATA | A | C | E | G | I | K | M | O |
| PRIORITY ORDER TABLE NUMBER (No. 3) | | | | | | | | | |
| (B) | PERFORMANCE INFORMATION | HIGH | HIGH | HIGH | HIGH | HIGH | LOW | LOW | LOW |
| | CONFIGURATION DATA | A | C | E | G | I | L | N | P |
| PRIORITY ORDER TABLE NUMBER (No. 2) | | | | | | | | | |
| (C) | PERFORMANCE INFORMATION | HIGH | HIGH | HIGH | LOW | LOW | LOW | LOW | LOW |
| | CONFIGURATION DATA | A | C | E | H | J | L | N | P |
| PRIORITY ORDER TABLE NUMBER (No. 1) | | | | | | | | | |
| (D) | PERFORMANCE INFORMATION | LOW | LOW | LOW | LOW | LOW | LOW | LOW | LOW |
| | CONFIGURATION DATA | B | D | F | H | J | L | N | P |

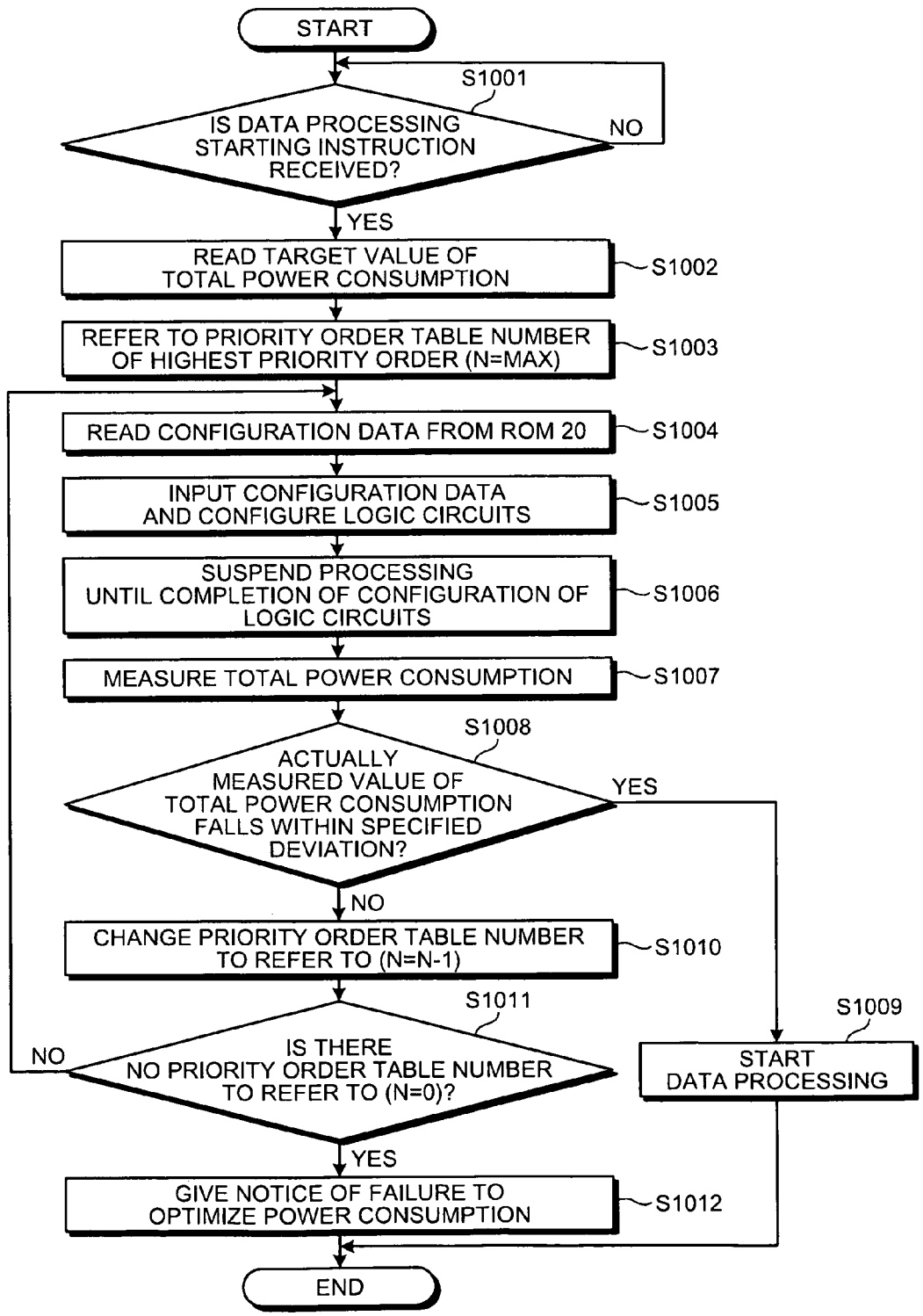

FIG.8

| PRIORITY ORDER TABLE NUMBER | PRIORITY ORDER: HIGH<br>BLOCK 1<br>BLOCK 2<br>BLOCK 3 | PRIORITY ORDER: MEAN<br>BLOCK 4<br>BLOCK 5 | PRIORITY ORDER: LOW<br>BLOCK 6<br>BLOCK 7<br>BLOCK 8 |
|---|---|---|---|
| NO.8 | PERFORMANCE: HIGH | PERFORMANCE: HIGH | PERFORMANCE: HIGH |
| NO.7 | PERFORMANCE: HIGH | PERFORMANCE: HIGH | PERFORMANCE: LOW |
| NO.6 | PERFORMANCE: HIGH | PERFORMANCE: LOW | PERFORMANCE: HIGH |
| NO.5 | PERFORMANCE: LOW | PERFORMANCE: HIGH | PERFORMANCE: HIGH |
| NO.4 | PERFORMANCE: HIGH | PERFORMANCE: LOW | PERFORMANCE: LOW |
| NO.3 | PERFORMANCE: LOW | PERFORMANCE: HIGH | PERFORMANCE: LOW |
| NO.2 | PERFORMANCE: LOW | PERFORMANCE: LOW | PERFORMANCE: HIGH |
| NO.1 | PERFORMANCE: LOW | PERFORMANCE: LOW | PERFORMANCE: LOW |

FIG.9

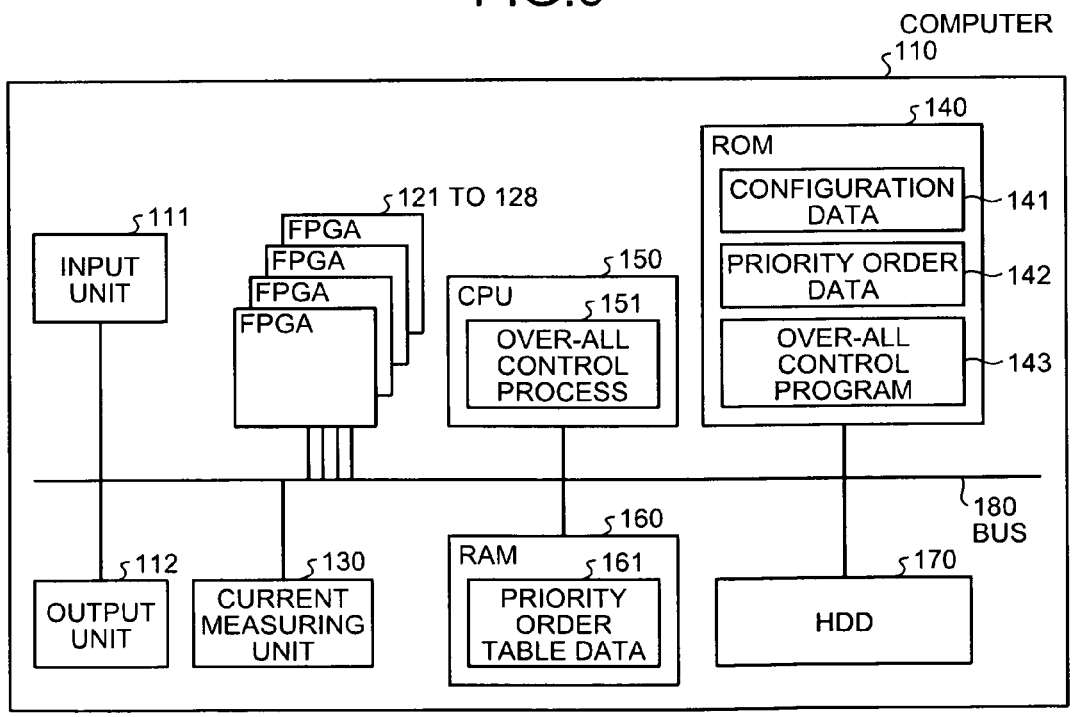

DATA PROCESSING APPARATUS AND METHOD

CROSS-REFERENCE TO RELATED APPLICATION(S)

This application is based upon and claims the benefit of priority of the prior Japanese Patent Application No. 2008-120136, filed on May 2, 2008, the entire contents of which are incorporated herein by reference.

FIELD

The embodiments discussed herein are directed to a data processing apparatus, a data processing method, and a computer readable storage medium.

BACKGROUND

Among packages (PKG) made by integrating a plurality of devices to execute data processing, there has been a package that, by applying an FPGA (Field Programmable Gate Array) to the devices, enables re-designing (re-configuration) of logic circuits to be configured onto the devices, respectively.

This package is required to allocate total power to the respective devices, in other words, to optimize power consumption to be consumed by each device, so that the package may achieve optimum data processing performance within the total power available to the package. For this reason, the conventional package has been developed and manufactured by a developer of packages according to a development flow described below.

Firstly, the developer prepares configuration data indicating the logic circuit to be configured onto the device, for each of the devices and determines in advance the power consumption to be consumed at the time of operation of each device onto which the logic circuit is configured. Next, the developer confirms that a total of the power consumption to be consumed by each device (total power consumption) falls within a target power value pre-established as a magnitude of the total power available to the package and is approximate to the target power value.

Then, the developer makes a test package (package for evaluation) in which the logic circuits are configured onto the devices, respectively, actually measures the total power consumption to be consumed by the data processing by this test package, and performs a test to see if an actually measured value of the total power consumption obtained by the measurement falls within the target power value and is approximate to the target power value.

If test results are obtained to the effect that "the actually measured value of the total power consumption is considerably smaller than the target power value", then the developer changes the logic circuit to be configured onto any device of the test package to a logic circuit of higher data processing performance so that the actually measured value of the total power consumption will come close to the target power value. Then, the developer makes the test package with the logic circuit changed and tests it again.

On the other hand, if test results are obtained to the effect that "the actually measured value of the total power consumption is greater than the target power value", then the developer changes the logic circuit to be configured onto any device of the test package to a logic circuit of lower data processing performance so that the actually measured value of the total power consumption will be within the target power value. Then, the developer makes the test machine with the logic circuit changed and tests it again.

If, after such trial and error, test results are obtained to the effect that "the actually measured value of the total power consumption falls within the target power value and is approximate to the target power value", then the developer manufactures this test package as an actual package.

There has been also disclosed the invention in which the logic circuits to be configured onto the devices is changed during actual execution of the data processing by the package, based on temperature of heat generated from the package or the device (see Japanese Laid-open Patent Publications Nos. 2006-244429 and 2004-022724). However, according to this invention, the total power consumption is not at all actually measured, thus the power consumption to be consumed by each device cannot be optimized in order to obtain maximum data processing performance.

The conventional package has a problem that it takes effort and working cost to develop the package. Namely, since the conventional package requires the package developer to make trial-and-error effort of selecting a device whose design is to be changed, making another test machine with the design changed, and testing the machine again, it has the problem that it takes effort to develop the package. The conventional package has also a problem that since it takes effort to develop the package, it takes the working cost to develop the package.

SUMMARY

According to an aspect of an embodiment, a data processing apparatus includes: a configuration data storing unit that stores, for each device that executes data processing assigned to itself, pieces of configuration data defining respective logic circuits that demonstrate different processing performances when the logic circuits are configured onto the devices, respectively; a logic circuit configuration unit that configures a combination of the logic circuits onto the devices by reading a piece of the configuration data for each device from the configuration data storing unit, from among the pieces of the configuration data, and inputting the read pieces of the configuration data to the devices, respectively; a total power consumption measuring unit that measures total power consumption required at a time of execution of the data processing by the devices onto which the logic circuits are configured by the logic circuit configuration unit; and a logic circuit determining unit that determines, from among combinations of the logic circuits configured by the logic circuit configuration unit, a combination in which an actually measured value of the total power consumption measured by the total power consumption measuring unit falls within a predetermined target value of the total power consumption and which demonstrates optimum processing performance as the logic circuits to be configured onto the devices at a time of actual execution of the data processing.

The objects and advantages of the invention will be realized and attained by unit of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

FIG. 3 is a diagram of one example of information to be stored in a ROM;

FIG. 4 is a diagram of one example of information to be stored on a priority order table;

FIG. 5 is a diagram of one example of configuration of a circuit possessed by a current measuring unit;

FIG. 6 is a diagram for explaining control by an over-all control unit;

FIG. 7 is a flow chart of a flow of processing by the package;

FIG. 8 is a diagram of one example of information to be stored on the priority order table according to a second embodiment; and FIG. 9 is a diagram of a computer that executes a data processing program.

DESCRIPTION OF EMBODIMENT(S)

Embodiments will now be described in detail of a data processing apparatus, a data processing method, and a data processing program according to the present invention with reference to the accompanying drawings. A package (data processing apparatus) to be installed in, for example, a GPON (Gigabit Capable Passive Optical Networks) will hereinafter be described as the embodiments.

[a] First Embodiment

In a first embodiment below, an outline, a configuration, and a processing flow, of the package will be described in sequence and an effect of the first embodiment will be described at last.

Outline of Package According to First Embodiment

Figure 1:
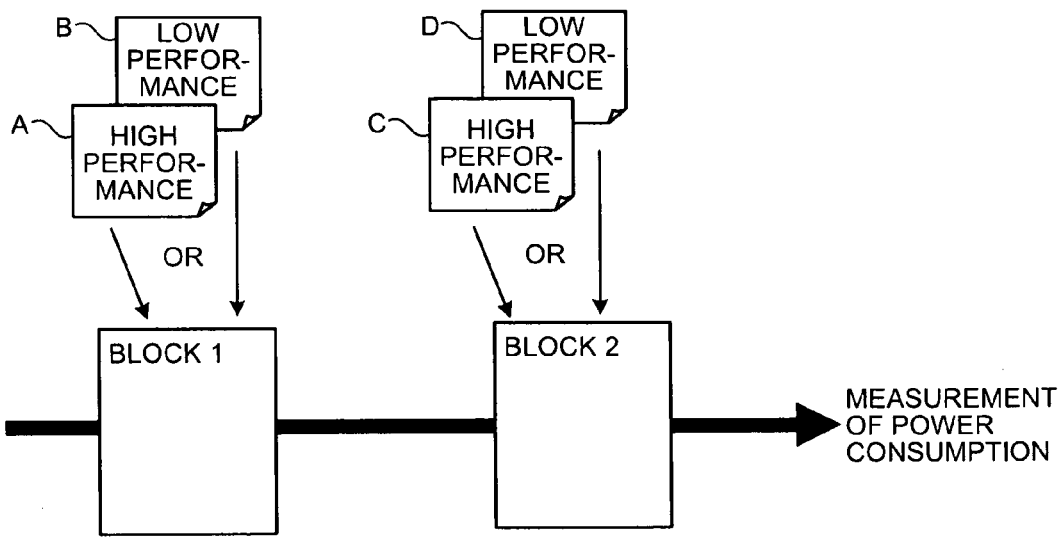
FIG. 1 is a diagram for description of an outline of a package according to a first embodiment.

The outline will firstly be described of the package according to the first embodiment with reference to FIG. 1. FIG. 1 is a diagram for description of the outline of the package according to the first embodiment.

The package according to the first embodiment is outlined to perform data processing and saves effort and working cost for development of the package.

Namely, the package according to the first embodiment stores, for each block having a device that executes the data processing assigned to itself, pieces of configuration data defining respective logic circuits that demonstrate different processing performances when the logic circuits are designed onto the devices, respectively.

On such premise, the package according to the first embodiment reads a piece of the configuration data for each block, from among the pieces of the configuration data of the different processing performances, and inputs the read pieces of the configuration data to the blocks, respectively, so as to configure a combination of the logic circuits onto the devices of the blocks.

Next, the package according to the first embodiment measures total power consumption required at a time of execution of the data processing by the devices onto which the logic circuits are configured.

Then, the package according to the first embodiment determines, from among the combinations of the logic circuits configured, a combination in which an actually measured value of the total power consumption falls within a predetermined target value of the total power consumption and which demonstrates optimum processing performance as the logic circuits to be configured onto the devices at a time of actual execution of the data processing.

Specifically describing with reference to FIG. 1, the package according to the first embodiment stores the configuration data A and B to be input to a block 1 and the configuration data C and D to be input to a block 2. The configuration data A defines the logic circuit of higher data processing performance than that of the logic circuit indicated by the configuration data B and the configuration data C defines the logic circuit of higher processing performance than that of the logic circuit indicated by the configuration data C.

On such premise, the package according to the first embodiment inputs, for example, the configuration data A to the block 1 and the configuration data C to the block 2 so as to configure one combination of the logic circuits onto the devices of the blocks, measures the total power consumption, and determines whether the total power consumption falls within the target value.

Then, the package according to the first embodiment further inputs, for example, the configuration data B to the block 1 and the configuration data D to the block 2 so as to configure another combination of the logic circuits onto the devices of the blocks, measures the total power consumption, and determines whether the total power consumption falls within the target value.

Then, it is assumed that the package according to the first embodiment obtains determination results to the effect that the total power consumption of the devices onto which the logic circuits have been configured by inputting the configuration data A and the configuration data C falls within the target value. In this case, the package according to the first embodiment determines the logic circuits to be configured onto the devices by inputting the configuration data A and the configuration data C as the logic circuits to be configured onto the devices at the time of actual execution of the data processing.

It is also assumed that the package according to the first embodiment obtains determination results to the effect that the total power consumption of the devices configured by inputting of the configuration data A and the configuration data C does not fall within the target value and that the total power consumption of the devices onto which the logic circuits have been configured by inputting of the configuration data B and the configuration data D falls within the target value. In this case, the package according to the first embodiment determines the logic circuits to be configured onto the devices by inputting the configuration data B and the configuration data D as the logic circuits to be configured onto the devices at the time of actual execution of the data processing.

From the above, the package according to the first embodiment is capable of saving effort and working cost for development of the packages. For example, the package according to the first embodiment, which is capable of automatically setting a combination that demonstrates the maximum performance within the target power consumption, is capable of saving effort and working cost for the development of the package.

[Configuration of Package]

Figure 2:
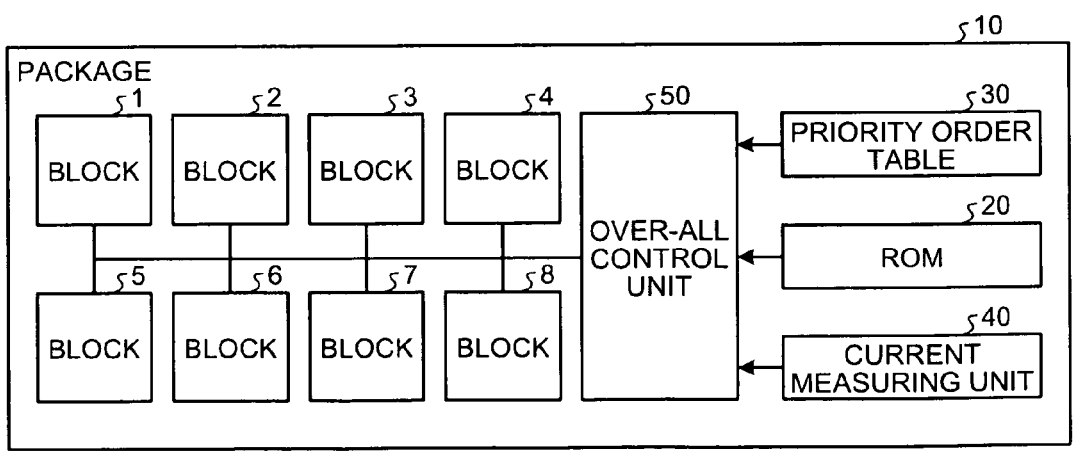
FIG. 2 is a block diagram of a configuration of the package.

Configuration of the package depicted in FIG. 1 will then be described with reference to FIG. 2 to FIG. 6. FIG. 2 is a block diagram of the configuration of the package; FIG. 3 is a diagram of one example of information to be stored in a ROM; FIG. 4 is a diagram of one example of information to be stored on a priority order table; FIG. 5 is a diagram of one example of configuration of a circuit possessed by a current measuring unit; and FIG. 6 is a diagram for explaining control by an over-all control unit.

As depicted in FIG. 2, this package 10 comprises blocks 1 to 8, a ROM (Read Only Memory) 20, a priority order table 30, a current measuring unit 40, and an over-all control unit 50.

Among these, each of the blocks 1 to 8 includes a re-configurable device capable of re-configuration of the logic circuit (e.g., FPGA) and executes the data processing assigned to itself by means of the logic circuit configured onto the device The ROM 20 corresponds to a storage medium to store data and programs and in particular stores, for each device, pieces of the configuration data defining their respective logic circuits that demonstrate different processing performances when the logic circuits are configured onto the devices, respectively.

Describing taking one specific example, the ROM 20 stores the configuration data of high processing performance (e.g., data A) and the configuration data of low processing performance (e.g., data B) for each of the blocks 1 to 8, as depicted in FIG. 3.

The priority order table 30 stores a priority order indicating the decreasing order of the processing performance predetermined by a user in correspondence with combination information for specifying a combination of the pieces of the configuration data to be input to the devices. Describing taking one specific example, the priority order table 30 stores information about categories of the priority order (high, mean, or low), and the blocks 1 to 8 belonging thereto, as depicted in FIG. 4.

Further, the priority order table 30 stores the combination information in correspondence with the priority order table number indicating the decreasing order of the processing performance.

Describing the combination information, the combination information corresponding to, for example, the priority order table number "No. 3" means that a piece of the configuration data corresponding to "performance: high" is respectively input to the blocks 1 to 5 and that a pieces of the configuration data corresponding to "performance: low" is respectively input to the blocks 6 to 8.

"Priority order: high (mean, or low)" is information used by the user for grouping the blocks 1 to 8 and means that the blocks 1 to 3 belonging to "priority order: high" are preferentially assigned the configuration data corresponding to "performance: high" as compared with the blocks 4 to 8 belonging to "priority order: mean" and "priority order: low".

The current measuring unit 40 sends out current to the blocks 1 to 8 each having the device onto which the logic circuit has been configured and measures the total power consumption required at the time of execution of the data processing by the devices.

The current measuring unit 40 includes, for example, such a circuit as depicted in FIG. 5. With respect to the power that is input from a power source and is sent out to blocks 1 to 8, the current measuring unit 40 measures a voltage difference between the voltage when output from the power source and the voltage after passage through a resistor R. The current measuring unit 40 then calculates a total of the power consumption (total power consumption) required for the data processing by the devices of the blocks 1 to 8, based on the measured voltage difference.

The over-all control unit 50 includes an internal memory for storing a control program, a program prescribing various procedures, and required data and executes various processing by means of these.

In particular, the over-all control unit 50 reads from the ROM 20 one piece of the configuration data for each device, from among the pieces of the configuration data of the different processing performances, and inputs the read pieces of the configuration data to the blocks 1 to 8, respectively, so as to configure the logic circuits onto the devices.

The over-all control unit 50 then causes the current measuring unit 40 to measure the total power consumption and determines, from among the combinations of the logic circuits configured onto the devices, a combination in which an actually measured value of the total power consumption falls within a predetermined target value of the total power consumption and which demonstrates optimum processing performance as the logic circuits to be configured onto the devices at the time of actual execution of the data processing.

Describing taking one specific example with reference to FIG. 6, the over-all control unit 50, upon reception of a data processing starting instruction, reads the predetermined target value of the total power consumption from a storage unit (e.g., a register of the over-all control unit 50).

Next, the over-all control unit 50, referring to the combination information corresponding to of No. 4 (N=Max), the priority order table number of highest priority order, from among the pieces of the combination information stored on the priority order table 30, reads the pieces of configuration data to be input to the blocks 1 to 8, respectively (data A, C, E, G, I, K, M, and O) from the ROM 20 (see (A) of FIG. 6).

In more detail, the over-all control unit 50 refers to the combination information corresponding to the priority order table number "No. 4" of the priority order table 30 and acquires "performance: high" corresponding to "priority order: high", "performance: high" corresponding to "priority order: mean", and "performance: high" corresponding to "priority order: low".

Then, the over-all control unit 50 reads, from the configuration data A and the configuration data B to be input to the block 1 corresponding to "priority order: high", the configuration data A corresponding to "performance: high" from the ROM 20.

The over-all control unit 50 then reads, from the configuration data C and the configuration data D to be input to the block 2 corresponding to "priority order: high", the configuration data C corresponding to "performance: high" from the ROM 20.

The over-all control unit 50 then reads, from the configuration data E and the configuration data F to be input to the block 3 corresponding to "priority order: high", the configuration data E corresponding to "performance: high" from the ROM 20.

The over-all control unit 50 then reads, from the configuration data G and the configuration data H to be input to the block 4 corresponding to "priority order: mean", the configuration data G corresponding to "performance: high" from the ROM 20.

The over-all control unit 50 then reads, from the configuration data I and the configuration data J to be input to the block 5 corresponding to "priority order: mean", the configuration data I corresponding to "performance: high" from the ROM 20.

The over-all control unit 50 then reads, from the configuration data K and the configuration data L to be input to the block 6 corresponding to "priority order: low", the configuration data K corresponding to "performance: high" from the ROM 20.

The over-all control unit 50 then reads, from the configuration data M and the configuration data N to be input to the block 7 corresponding to "priority order: low", the configuration data M corresponding to "performance: high" from the ROM 20.

The over-all control unit 50 then reads, from the configuration data O and the configuration data P to be input to the block 8 corresponding to "priority order: low", the configuration data O corresponding to "performance: high" from the ROM 20.

After reading the respective pieces of the configuration data from the ROM 20, the over-all control unit 50 inputs the configuration data to the blocks 1 to 8, respectively and configures the logic circuits onto the devices.

Then, the over-all control unit 50 suspends processing until the logic circuits are configured onto the devices of the blocks 1 to 8 and, upon completion of the configuration of the logic circuits, controls the current measuring unit 40 so as to measure the total power consumption.

Then, the over-all control unit 50 determines whether the actually measured value of the total power consumption measured by the current measuring unit 40 falls within specified deviation calculated based on the target value of the total power consumption.

If it is determined that the actually measured value of the total power consumption falls within the specified deviation, then the over-all control unit 50 starts the data processing using the blocks 1 to 8 each having the device onto which the logic circuit has been configured.

On the other hand, if it is determined that the actually measured value of the total power consumption does not fall within the specified deviation, then the over-all control unit 50 changes the combination of the pieces of the configuration data to be input to the devices to a combination of the pieces of the configuration data of one rank lower priority order.

Specifically, the over-all control unit 50 changes the referred-to priority order table number to the priority order table number of No. 3 (N=N−1) which is the lower number of the priority order by 1.

Next, the over-all control unit 50, referring to the combination information corresponding to the priority order table number "No. 3", from among the pieces of the combination information stored on the priority order table 30, reads the pieces of the configuration data to be input to the blocks 1 to 8, respectively (data A, C, E, G, I, L, N, and P) from the ROM 20 (see (B) of FIG. 6).

Then, the over-all control unit 50 inputs the configuration data to the blocks 1 to 8, respectively and configures the logic circuits on the devices.

Then, the over-all control unit 50 suspends processing until the logic circuits are designed onto the devices of the blocks 1 to 8 and, upon completion of configuration of the logic circuits, controls the current measuring unit 40 so as to measure the total power consumption.

Then, the over-all control unit 50 determines again whether the actually measured value of the total power consumption measured by the current measuring unit 40 falls within the specified deviation and if it is determined that the actually measured value of the total power consumption falls within the specified deviation, then the over-all control unit 50 starts the data processing using the blocks 1 to 8 each having the device onto which the logic circuit has been designed.

On the other hand, if it is determined that the actually measured value of the total power consumption does not fall within the specified deviation, then the over-all control unit 50 changes the combination of the pieces of the configuration data to be input to the devices to a combination of the pieces of the configuration data of one rank lower priority order.

Specifically, the over-all control unit 50 changes the referred-to priority order table number to the priority order table number "No. 2" (N=N−1) which is the lower number of the priority order by 1.

Next, the over-all control unit 50, referring to the combination information corresponding to the priority order table number "No. 2", from among the pieces of the combination information stored on the priority order table 30, reads the pieces of the configuration data to be input to the blocks 1 to 8, respectively (data A, C, E, H, J, L, N, and P) from the ROM 20 (see (C) of FIG. 6).

Then, the over-all control unit 50 inputs the configuration data to the blocks 1 to 8, respectively and configures the logic circuits on the devices.

Then, the over-all control unit 50 suspends processing until the logic circuits are designed onto the devices of the blocks 1 to 8 and, upon completion of configuration of the logic circuits, controls the current measuring unit 40 so as to measure the total power consumption.

Then, the over-all control unit 50 determines again whether the actually measured value of the total power consumption as measured by the current measuring unit 40 falls within the specified deviation and if it is determined that the actually measured value of the total power consumption falls within the specified deviation, then the over-all control unit 50 starts the data processing using the blocks 1 to 8 each having the device onto which the logic circuit has been configured.

On the other hand, if it is determined that the actually measured value of the total power consumption does not fall within the specified deviation, then the over-all control unit 50 changes the combination of the pieces of configuration data to be input to the devices to a combination of the pieces of the configuration data of one rank lower priority order.

Specifically, the over-all control unit 50 changes the referred-to priority order table number to the priority order table number "No. 1" (N=N−1) which is the lower number of the priority order by 1.

Next, the over-all control unit 50, referring to the combination information corresponding to the priority order table number "No. 1", from among the pieces of the combination information stored on the priority order table 30, reads the pieces of the configuration data to be input to the blocks 1 to 8, respectively (data B, D, F, H, J, L, N, and P) from the ROM 20 (see (D) of FIG. 6).

Then, the over-all control unit 50 inputs the configuration data to the blocks 1 to 8, respectively and configures the logic circuits on the devices.

Then, the over-all control unit 50 suspends processing until the logic circuits are designed onto the devices of the blocks 1 to 8 and, upon completion of configuration of the logic circuits, controls the current measuring unit 40 so as to measure the total power consumption.

Then, the over-all control unit 50 determines again whether the actually measured value of the total power consumption as measured by the current measuring unit 40 falls within the specified deviation and if it is determined that the actually measured value of the total power consumption falls within the specified deviation, then the over-all control unit 50 starts the data processing using the blocks 1 to 8 each having the device onto which the logic circuit has been configured.

On the other hand, if it is determined that the actually measured value of the total power consumption does not fall within the specified deviation, then the over-all control unit 50 changes the combination of the pieces of configuration data to be input to the devices to a combination of the pieces of the configuration data of one rank lower priority order.

At this moment, since there is no priority order table number (N=0) of the priority order lower than that of the priority order table number "No. 1", the over-all control unit 50 gives an alarm to notify the user of failure to optimize the power consumption to be consumed by each of the blocks 1 to 8.

[Processing by Package]

A flow of processing by the package 10 will then be described with reference to FIG. 7. FIG. 7 is a flow chart of the flow of the processing by the package 10.

As depicted in FIG. 7, the package 10 waits (step S1001: NO) until reception of a data processing starting instruction upon reception (step S1001: Yes), package 10 reads the predetermined target value of the total power consumption from the storage unit (step S1002).

Next, the package 10, referring to the priority order table number of the highest priority order (N=Max) (step S1003), reads the pieces of the configuration data to be input to the blocks 1 to 8, respectively from the ROM 20 (step S1004).

Then, the package 10 inputs the configuration data to the blocks 1 to 8, respectively and configures the logic circuits onto the devices (step S1005).

The package 10 suspends processing until the configuration of the logic circuits is completed (step S1006) and, upon completion of the configuration of the logic circuits, measures the total power consumption (step S1007) and determines whether the actually measured value falls within the specified deviation (step S1008).

If it is determined that the actually measured value falls within the specified deviation (step S1008: Yes), then the package 10 starts the data processing using the blocks 1 to 8 each having the device onto which the logic circuit has been designed (step S1009) and, upon completion of the data processing, terminates the processing.

On the other hand, if it is determined that the actually measured value does not fall within the specified deviation (step S1008: No), then the package 10 changes the referred-to priority order table number to the priority order table number (N=N−1) which is the lower number of the priority order (step S1010).

Here, if there is no priority order table number to refer to (N=0) (step S1011: Yes), then the package 10 notifies the user of the failure to optimize the power consumption to be consumed by each of the blocks 1 to 8 (step S1012) and terminates the processing.

On the other hand, if there is a priority order table number to refer to (step S1011: No), then the package 10 again reads the performance information of the pieces of the configuration data to be respectively input to the blocks 1 to 8 from the priority order table 30 (step S1004) and repeatedly executes the above processing (step S1004 to step S1011).

Effect of First Embodiment

As described above, according to the first embodiment, the effort and working cost can be saved for the development of the package. For example, according to the first embodiment, since the power consumption can automatically be optimized by the manufactured package, the effort and working cost can be saved that are required for the development of the package.

According to the first embodiment, the power consumption can be optimized within a short time. For example, according to the first embodiment, since the total power consumption is measured in the priority order of the combinations of the pieces of the configuration data set by the developer of the package, the power consumption can be optimized within a short time.

According to the first embodiment, a manufacturing error can be recovered that is caused at the time of manufacturing the package. For example, according to the first embodiment, even in the case of an error being caused to the power consumption to be consumed at the time of operation of the blocks 1 to 8, since the power consumption can be optimized for each manufactured package, the manufacturing error can be recovered that is caused at the time of manufacturing the package.

Second Embodiment

[b] Second Embodiment

While the first embodiment has been described so far, the present invention may be practiced in various different embodiments, other than the embodiment described above. Therefore, another embodiment will now be described as a second embodiment.

For example, in the first embodiment, explanation was made for the case of determining the logic circuits at the time of obtaining the determination results that the actually measured value of the total power consumption is approximate to the target value as the logic circuits to be configured onto the devices at the time of actual execution of the data processing.

However, it may also be practiced, for example, to measure the total power consumption every time the logic circuits are configured onto the device, respectively, and determine, from among combinations of the logic circuits for which the determination results that the actually measured value of the total power consumption of the devices is approximate to the target value have been obtained, the logic circuits capable of obtaining the maximum data processing performance as the logic circuits to be configured onto the devices at the time of actual execution of the data processing.

In the first embodiment, explanation is made for the case of storing the configuration data of high processing performance and the configuration data of low processing performance for each of the blocks 1 to 8. However, even the case of storing three or more kinds of configuration data of different processing performances may be applied to the present invention.

The procedures, the control process, specific designations, and information containing various data and parameters described in the above description and depicted in the drawings (e.g., stored information depicted in FIG. 3 and FIG. 4 and the priority order, the priority order table number, etc., depicted in FIG. 4) may arbitrarily be changed except as specifically noted otherwise.

For example, even the case of the user arbitrarily establishing the priority order table numbers irrespective of the priority order (high, mean, or low) as depicted in FIG. 8 may be applied to the present invention. FIG. 8 is a diagram of one example of information to be stored on the priority order table according to the second embodiment.

Each constituent element of each apparatus illustrated is given in a functionally conceptual manner, and is not necessarily required to be physically configured as illustrated. Namely, specific forms of distribution and integration of each apparatus are not limited to those illustrated in drawings, and the whole or part thereof may be functionally or physically distributed or integrated by arbitrary units depending on various loads or use situations. For example, the ROM 20 and the priority order table 30 depicted in FIG. 2 may be integrated.

Furthermore, each processing function executed by each apparatus may be fully or partly implemented by a CPU or a program analyzed and executed by the CPU, or implemented by hardware.

Incidentally, it may also be so arranged that the present invention will be realized by executing a pre-arranged program on a computer as the data processing apparatus having the package 10. Accordingly, as an example, the computer will now be described with reference to FIG. 9 that executes the data processing program having the same function as that of the package 10 described in the above embodiment. FIG. 9 is a diagram of the computer that executes the data processing program.

As depicted in FIG. 9, a computer 110 as the data processing apparatus having the package 10 is configured by connecting an input unit 111, an output unit 112, FPGAs 121 to 128, a current measuring unit 130, a ROM 140, a CPU 150, a RAM 160, and an HDD 170 via a bus 180, etc. The FPGAs 121 to 128 correspond to the blocks 1 to 8, respectively, depicted in FIG. 2, and the current measuring unit 130 corresponds to the current measuring unit 40 depicted in FIG. 2.

Stored in advance in the ROM 140 are configuration data 141, priority order data 142, and an over-all control program 143 that demonstrates the same function as that of the over-all control unit 50 described in the first embodiment. The configuration data 141, the priority order data 142, and the over-all control program 143 may appropriately be integrated or distributed in the same manner as each constituent element of the package 10 depicted in FIG. 2. The configuration data 141 corresponds to the ROM 20 depicted in FIG. 2.

The CPU 150 reads out the over-all control program 143 from the ROM 140 and executes the over-all control program 143, thus making it possible to make the over-all control program 143 to serve as the over-all control process 151 as depicted in FIG. 9. The over-all control process 151 corresponds to the over-all control unit 50 depicted in FIG. 2.

The CPU 150 reads out the priority order data 142 from the ROM 140, stores the priority order data 142 in the RAM 160, and executes processing based on priority order table data 161 stored in the RAM 160. The priority order table data 161 corresponds to the priority order table 30 depicted in FIG. 2.

The configuration data 141, the priority order data 142, and the over-all control program 143 are not necessarily required to be stored in the ROM 140 in advance. For example, it may be so arranged that the respective programs will be stored in a "portable-use physical medium" such as a flexible disc (FD), a CD-ROM, a DVD disc, a magneto-optical disc, and an IC card that is inserted into the computer 110, or a "fixed-use physical medium" such as an HDD that is installed inside and outside the computer 110, or furthermore, "other computer (or server)" connected to the computer 110 via public lines, the Internet, a LAN, a WAN, etc., and the computer 110 reads out the respective programs from such medium and executes these programs.

The data processing method described in the second embodiment may be realized by executing a pre-arranged program on the computer such as a personal computer and a workstation. This program may be distributed via a network such as the Internet. This program may also be recorded on a computer-readable recording medium such as a hard disc, the flexible disc (FD), the CD-ROM, an MO, and the DVD and executed by being read out from the recording medium by the computer.

The disclosed data processing apparatus, data processing method, and data processing program are capable of saving effort and working cost required for the development of the package.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A data processing apparatus comprising:
   a configuration data storing unit that stores, for each device that executes data processing assigned to itself, pieces of configuration data defining respective logic circuits that demonstrate different processing performances when the logic circuits are configured onto the devices, respectively;
   a logic circuit configuration unit that configures a combination of the logic circuits onto the devices by reading a piece of the configuration data for each device, from among the pieces of the configuration data stored in the configuration data storing unit, and inputting the read pieces of the configuration data to the devices, respectively;
   a total power consumption measuring unit that measures total power consumption required at a time of execution of the data processing by the devices onto which the logic circuits are configured by the logic circuit configuration unit; and
   a logic circuit determining unit that determines, from among combinations of the logic circuits configured by the logic circuit configuration unit, a combination in which an actually measured value of the total power consumption measured by the total power consumption measuring unit falls within a predetermined target value of the total power consumption and which demonstrates optimum processing performance as the logic circuits to be configured onto the devices at a time of actual execution of the data processing.

2. The data processing apparatus according to claim 1, further comprising:
   a priority order table that stores a priority order indicating the decreasing order of the processing performance predetermined by a user in correspondence with combination information for specifying a combination of the pieces of the configuration data to be input to the devices, wherein
   the logic circuit configuration unit refers to the combination information stored on the priority order table, in the decreasing order of the processing performance, based on the priority order, and reads the pieces of the configuration data to be input to the devices from the configuration data configuration unit so as to configure the logic circuits onto the devices, respectively,
   the total power consumption measuring unit measures the total power consumption every time the logic circuits are configured onto the devices by the logic circuit configuration unit, and
   the logic circuit determining unit determines whether the actually measured value of the total power consumption is within the target value of the total power consumption every time the total power consumption is measured by the total power consumption measuring unit and, in the case of obtaining determination results to the effect that the actually measured value of the total power consumption falls within the target value of the total power consumption, determines the combination of the logic circuits configured by the logic circuit configuration unit as the logic circuits to be configured onto the devices at the time of actual execution of the data processing and, in the case of obtaining determination results to the effect that the actually measured value of the total power consumption does not fall within the target value of the total power consumption, changes the combination information to be referred to by the logic circuit configuration unit to the combination information of one rank lower priority order.

3. A data processing method comprising:

storing, for each device that executes data processing assigned to itself, pieces of configuration data defining respective logic circuits that demonstrate different processing performances when the logic circuits are configured onto the devices, respectively;

configuring a combination of the logic circuits onto the devices by reading a piece of the configuration data for each device, from among the pieces of the configuration data stored in the storing, and inputting the read pieces of the configuration data to the devices, respectively;

measuring total power consumption required at a time of execution of the data processing by the devices onto which the logic circuits are configured in the configuring; and determining, from among combinations of the logic circuits configured in the configuring, a combination in which an actually measured value of the total power consumption measured in the measuring falls within a predetermined target value of the total power consumption and which demonstrates optimum processing performance as the logic circuits to be configured onto the devices at a time of actual execution of the data processing.

4. A computer readable storage medium containing instructions that, when executed by a computer, causes the computer to perform:

storing, for each device that executes data processing assigned to itself, pieces of configuration data defining respective logic circuits that demonstrate different processing performances when the logic circuits are configured onto the devices, respectively;

configuring a combination of the logic circuits onto the devices by reading a piece of the configuration data for each device, from among the pieces of the configuration data stored in the storing, and inputting the read pieces of the configuration data to the devices, respectively;

measuring total power consumption required at a time of execution of the data processing by the devices onto which the logic circuits are configured in the configuring; and determining, from among combinations of the logic circuits configured in the configuring, a combination in which an actually measured value of the total power consumption measured in the measuring falls within a predetermined target value of the total power consumption and which demonstrates optimum processing performance as the logic circuits to be configured onto the devices at a time of actual execution of the data processing.

* * * * *